United States Patent [19]

Greene et al.

[11] Patent Number: 4,994,765

[45] Date of Patent: Feb. 19, 1991

[54] STABILIZED GATED OSCILLATOR UTILIZING A CERAMIC RESONATOR

[75] Inventors: David C. Greene; Edwin R. Meyer, both of Knoxville, Tenn.

[73] Assignee: North American Philips Corporation, New York, N.Y.

[21] Appl. No.: 505,089

[22] Filed: Apr. 4, 1990

[51] Int. Cl.[5] .............................................. H03B 5/32
[52] U.S. Cl. .................................. 331/158; 331/173; 331/DIG. 3
[58] Field of Search ............. 331/116 R, 116 FE, 158, 331/172, 173, DIG. 3

[56] References Cited

U.S. PATENT DOCUMENTS 3,916,345 10/1975 Eberlein et al. .............. 331/DIG. 3
4,864,255 9/1989 Yoshida ......................... 331/173 X
4,896,122 1/1990 Tahernia et al. .................... 331/158
4,904,962 2/1990 Greene ............................ 331/117 R Primary Examiner—Siegfried H. Grimm
Attorney, Agent, or Firm—Edward W. Goodman

[57] ABSTRACT

A stabilized gated oscillator that provides pulses at a predetermined repetition rate in phase coherence with a gating signal includes a ceramic resonator in a feedback resonant circuit between the output terminal and the input terminal of a linear amplifier. The resonant circuit, which establishes the repetition rate, is constructed to provide an oscillator frequency in a frequency range between two resonant frequencies of the ceramic resonator wherein the ceramic resonator acts as an inductance.

7 Claims, 2 Drawing Sheets

FIG. 3
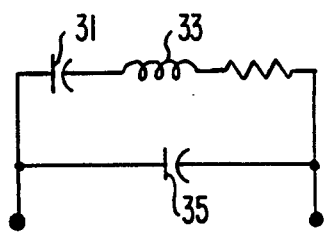
FIG. 5
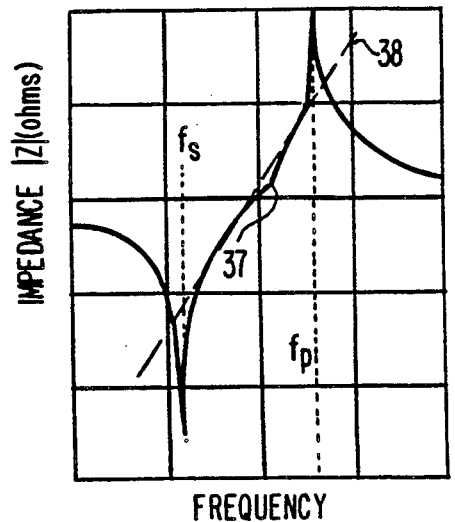
FIG. 4
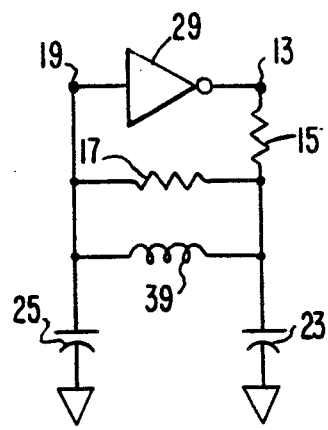
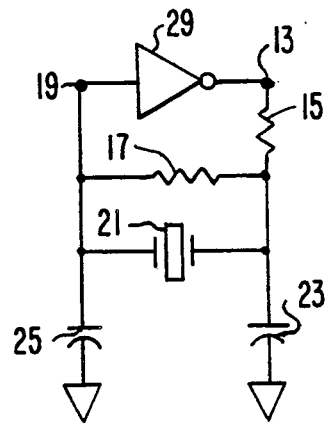
FIG. 2B    FIG. 2A

STABILIZED GATED OSCILLATOR UTILIZING A CERAMIC RESONATOR

BACKGROUND OF THE INVENTION

1. Field of the Invention

The invention relates to the field of stabilized oscillators and more particularly to stabilized oscillators which provide a train of square wave pulses synchronized to an applied gating signal.

2. Description of the Prior Art

A gated rectangular pulse oscillator in the prior art utilized a RC circuit to establish a relaxation oscillator after a gating signal was applied The oscillation period of these devices is a function of the resistor R, the capacitor C, and the high and low transition voltages Since these values may vary with temperature the oscillation period may also vary. Thus, the oscillation frequency of these devices varies with temperature. Further, the switching voltages are modulated by circuit noise, causing the leading and trailing edges of the oscillator pulses to jitter in a random fashion.

A stabilized oscillator that exhibits greater frequency stability and improved edge jitter performance, relative to the RC relaxation oscillators is disclosed by David C. Greene in U.S. patent application Ser. No. 304,698 filed on Jan. 31, 1989, now U.S. Pat. No. 4,904,962, assigned to the Assignee of the present invention, and incorporated herein by reference The oscillator disclosed in application Ser. No. 304,698 utilizes an LC resonator as the frequency controlling element. This circuit appreciably improves the frequency stability and significantly lowers the edge jitter relative to that of the RC relaxation oscillator. The coils, however, are relatively large and the circuit requires tuning due to the inductive tolerance range within which the coils may be manufactured. This tuning adds an additional step in the manufacturing process and coupled with the price of the coil renders the LC controlled gated oscillator relatively expensive.

SUMMARY OF THE INVENTION

A gated oscillator in accordance with the present invention includes a NAND gate which is biased by coupling the output terminal via a high value resistor in the order of one to ten megaohms to one of two input terminals of the NAND gate. When a low level signal is coupled to the second input terminal of the NAND gate, the NAND gate turns on and the signal at the output terminal goes high after which no further action is possible. This output signal is coupled via the high value resistor to the first input terminal of the NAND gate. At an established threshold level, the NAND gate stabilizes with the signal at the first input terminal equal to the threshold signal at the output terminal In this situation the NAND gate is in the center of its operating region and acts as a linear amplifier with some forward gain. A ceramic resonator, having series and parallel resonant frequencies and which acts as an inductance at frequencies between the two resonant frequencies, is also coupled between the output terminal and the first input terminal of the NAND gate. Capacitors coupled to the first input terminal and the output terminal of the NAND gate complete a resonant circuit with the inductance provided by the ceramic resonator. The capacitors are initially charged to the high level signal at the output terminal of the NAND gate, thereby providing a high level signal at the first input terminal of the NAND gate. When a high level signal is coupled to the second input terminal of the NAND gate, both input terminals are at a high level, causing the signal at the output terminal to go to a low level. With this transition the circuit, after an initial time delay, commences to oscillate, providing a train of rectangular pulses at a repetition rate determined by the resonant frequency of the inductance, provided by the ceramic resonator, with the capacitors coupled to the first input terminal and the output terminal of the NAND gate.

Advantages and the above mentioned features of the invention will become more apparent from the following description of a preferred embodiment thereof with reference to the accompanying drawings.

BRIEF DESCRIPTION OF THE DRAWINGS

FIGS. 2A and 2B are equivalent circuit diagrams of the embodiment of FIG. 1.

FIG. 3 is an equivalent circuit diagram of the ceramic resonator shown in FIGS. 1 and 2A.

FIG. 4 is an impedance versus frequency plot for the ceramic resonator, illustrating the frequency region at which it acts as an inductance.

FIG. 5 is an equivalent circuit of the ceramic resonator when operated at a frequency within the frequency region in which it acts as an inductance.

DESCRIPTION OF THE PREFERRED EMBODIMENTS

Figure 1:
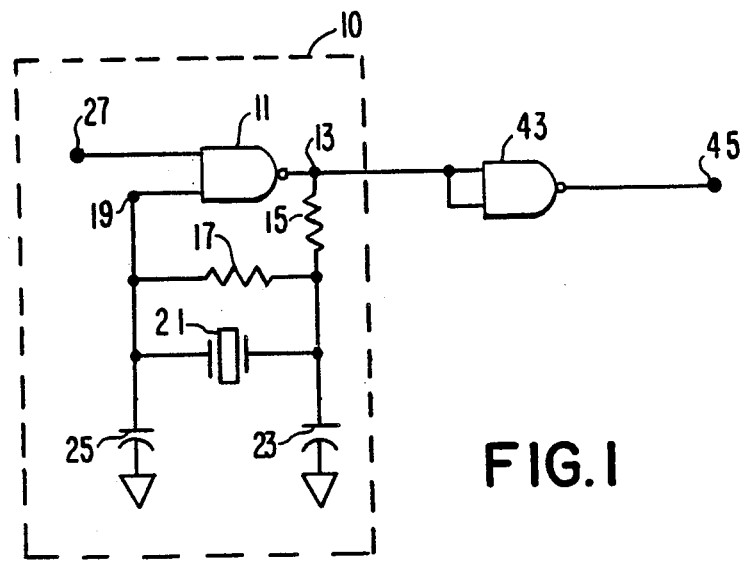
FIG. 1 is a schematic diagram of a preferred embodiment on the invention.

Refer now to FIG. 1. A stabilized gated oscillator 10 may include a NAND gate 11 having its output terminal 13 coupled via resistors 15 and 17 to an input terminal 19. A ceramic resonator 21 coupled in parallel with the resistor 17 may have one end coupled to ground via a capacitor of 23 of value $C_1$ and the other end coupled to ground via capacitor 25 of value $C_2$. When a low level signal is coupled to a second input terminal 27 of the NAND gate 11 the signal at the output terminal 13 increases. This output signal is coupled via the resistors 15 and 17 to the input terminal 19. The resistor 17 has a value $R_1$ which may be between one and ten megaohms, while the resistor 15 has a value $R_2$ which may be approximately one thousand ohms. When the signal at the output terminal 13 achieves a preestablished threshold level, the NAND gate 11 stabilizes with the signal at the input terminal 19 equal to the threshold signal at the output terminal 13, thus preventing any further increases in the level of the signal at the output terminal After the NAND gate 11 is stabilized the signal at the output terminal 13 is in the center of the linear portion of the operating region and the NAND gate acts as a linear amplifier with some forward gain This is illustrated in FIG. 2A. In all figures, previously mentioned elements bear the initially assigned reference numerals.

The circuit shown in FIG. 2A will oscillate when the loop gain, the product of the amplifying gain multiplied by the gain of the feedback loop, is equal to or greater then one. The resistor 17 is of a sufficiently high value as to not effect the basic operation of the oscillator circuit, while the resistor 15 augments the output impedance of the amplifier 29. Since the output impedance of the amplifier 29 is of a value much lower than the value $R_2$ of the resistor 15, the impedance that is seen by the resonant circuit of capacitor 23, ceramic resonator 21, and capacitor 25 is substantially equal to $R_2$.

The ceramic resonator 21 may be of the type known as CST 12 MT provided by Murata-Erie, North America, Inc., of Smyrna, Georgia. An equivalent circuit for this ceramic resonator is shown in FIG. 3. It is evident from the figure that the ceramic resonator has two resonant frequencies, the first fs is due to the series resonance of the capacitor 31 of value $C_{r1}$ with the inductor 33 of value $L_1$. The second resonant frequency $f_p$ is due to the parallel resonance of the capacitor 35 of value $C_{r2}$ with the series circuit of inductor 33 and capacitor 31. The two resonances may be determined from the following formulas:

$$f_s = \frac{1}{2\pi \sqrt{L_1 C_{r1}}}$$

$$f_p = \frac{1}{2\pi \sqrt{L_1 C_{r1} C_{r2}/(C_{r1} + C_{r2})}} = f_s \sqrt{1 + C_{r1}/C_{r2}}$$

A plot of the magnitude of the impedance versus frequency for the circuit of FIG. 3 is shown in FIG. 4 A segment 37 of the curve between the series resonant frequency $f_s$ and the parallel resonant frequency $f_p$ is substantially linear and may be approximated by a straight line 38. The slope of this line divided by $2\pi$ is equal to the inductance provided by the ceramic resonator 21 between the two resonant frequencies. An equivalent circuit for this region of the curve is shown in FIG. 5 wherein the value L of the inductance 39 is equal to the slope of the curve 37 divided by $2\pi$ and the resistor 41 is a function of the Q of the circuit. Since the Q is relatively high the resistance 41 is low and the series circuit of FIG. 5 may be represented as a pure inductance of value L, as shown in the oscillator circuit of FIG. 2B.

With a high level voltage applied to the input terminal 27 of NAND gate 11 and a bias voltage applied to terminal 19 via resistors 15 and 17, as previously described, NAND gate 11 performs as a linear amplifier 29. The gain of this linear amplifier, shown in FIG. 2B, is sufficient to establish an oscillator with the feedback of the signal at the output terminal 13 to the input terminal 19 via the resonant circuit established by the capacitors 23 and 25 with the inductance 39. Prior to the application of the high level signal at the input terminal 27 the signal at the output terminal 13 is high and the capacitors 23 and 25 are charged through resistor 15 to establish high level signals at the terminals 13 and 19, as previously described. When a high level signal is applied to the input terminal 27, both input terminals to the NAND gate 11 are at high levels causing the signal at the output terminal 13 to go to a low level and the capacitor 23 to discharge through the resistor 15 and the low level output impedance of the amplifier 29. This causes a current to flow in the inductance 39 permitting the capacitor 25 to discharge through the inductance, the resistor 15 and the output impedance of the amplifier 29. The discharging of the capacitors 23 and 25 establishes a low level signal at the input terminal 19, causing the amplifier 29 to cut off and reestablish a high level signal at the output terminal 13. Capacitors 23 and 25 are then recharged until the threshold level is achieved at the output terminal 13 and the input terminal 19, once again causing a low level signal at the output terminal 13 and the capacitors 23 and 25 to proceed to discharge and repeat the cycle. The charging and discharging of the capacitors 23 and 25 is at a rate f determined by the resonant frequency of the circuit. This frequency is given by:

$$f_0 = \frac{1}{2\pi \sqrt{L C_1 C_2/(C_1 + C_2)}}$$

It should recognized that $f_O$ must be in the frequency range between fs and fp, i.e. $f_s < f_O < f_p$.

Figure 6:
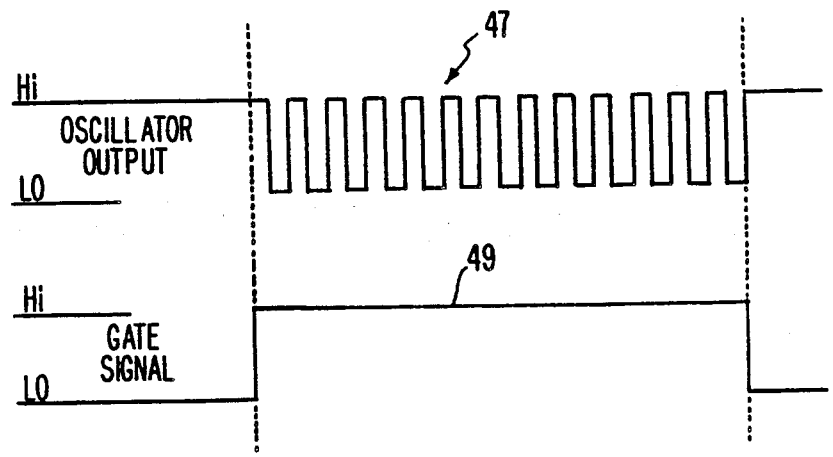
FIG. 6 illustrates the gated signal output of the circuit shown in FIG. 1.

Refer again to FIG. 1. As previously stated, the signal at the output terminal 13 which is initially at a high level is transformed to a low level upon the application of the high level signal at the input terminal 27. Thus the signal at the output terminal 13 is 180° out of phase with the gating signal at the input terminal 27. To invert the phase, an inverter 43 is coupled between the output terminal 13 of the NAND gate 11 and an output terminal 45, at which a train of pulses 47, is provided for the duration of a gate signal 49 applied to the input terminal 27, as shown in FIG. 6.

The Q of the ceramic resonator 21 is low enough to permit rapid switching of the NAND gate 11 and thus establish phase coherency with the gating signal at the input terminal 27, yet high enough to establish a highly stabilized oscillator. Extremely high Qs, such as those exhibited by piezo-electric resonators like quartz crystals, do not permit such rapid switching and phase synchronization with a gating signal is not possible with these devices.

While the invention has been described in its preferred embodiments, it is to be understood that the words which have been used are words of description rather than of limitation and that changes within the purview of the appended claims may be made without departure from the true scope and spirit of the invention in its broader aspects.

I claim:

1. A pulse generator for providing a train of pulses at a predetermined repetition rate upon reception of, and in phase coherency with, a gating signal comprising:
    a gated amplifier having an input terminal, an output terminal, and input means for receiving said gating signal, said amplifier enabled upon reception of said gating signal at said input means; and
    resonant circuit means coupled between said output terminal and said input terminal for establishing said predetermined repetition rate, said resonant circuit means including a ceramic resonator having a first resonant frequency and a second resonant frequency, said ceramic resonator operating in said resonant circuit means as an inductance element at frequencies between said first and second resonant frequencies.

2. A pulse generator in accordance with claim 1 wherein said gated amplifier is a NAND gate having first and second input ports and an output port corresponding respectively to said input means, said input terminal, and said output terminal and including means coupled between said output port and said second input port for biasing said NAND gate to a level where at it operates as a linear amplifier.

3. A pulse generator in accordance with claim 2 wherein said resonant circuit means includes capacitor means coupled to said input port and said output port for cooperating with said ceramic resonator to provide said predetermined repetition rate.

4. A pulse generator in accordance with claim 2 wherein said biasing means is a resistor coupled between said output port and said second input port.

5. A pulse generator in accordance with claim 1 wherein said resonant circuit means includes capacitor means coupled to said input terminal and said output terminal for cooperating with said ceramic resonator to control said repetition rate.

6. A pulse generator in accordance with claim 3 wherein said biasing means is a resistor coupled between said output port and said second input port.

7. A pulse generator in accordance with claim 6 further including inverting means coupled to said output port of said NAND gate for providing 180° phase shift to signals coupled to said output port of said NAND gate so that signals at an output terminal of said inverting means are in phase coherence with said gating signal.

7. A pulse generator in accordance with claim 6 further including inverting means coupled to said output port of said NAND gate for providing 180° phase shift to signals coupled to said output port of said NAND gate so that signals at an output terminal of said inverting means are in phase coherence with said gating signal.

* * * * *